US011909327B2

(12) United States Patent
Raimann et al.

(10) Patent No.: US 11,909,327 B2
(45) Date of Patent: Feb. 20, 2024

(54) HALF-BRIDGE MODULE FOR AN INVERTER OF AN ELECTRIC DRIVE OF AN ELECTRIC VEHICLE OR A HYBRID VEHICLE AND AN INVERTER FOR AN ELECTRIC DRIVE OF AN ELECTRIC VEHICLE OR A HYBRID VEHICLE

(71) Applicant: ZF Friedrichshafen AG, Friedrichshafen (DE)

(72) Inventors: Manuel Raimann, Salem (DE); Ivonne Trenz, Friedrichshafen (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 267 days.

(21) Appl. No.: 17/233,189

(22) Filed: Apr. 16, 2021

(65) Prior Publication Data
US 2021/0344276 A1    Nov. 4, 2021

(30) Foreign Application Priority Data

Apr. 29, 2020   (DE) .......................... 102020205420.7

(51) Int. Cl.
  *H02M 7/00*  (2006.01)
  *H02P 27/06*  (2006.01)

(52) U.S. Cl.
  CPC ............ *H02M 7/003* (2013.01); *H02P 27/06* (2013.01)

(58) Field of Classification Search
  CPC ... H02M 7/00; H05K 1/18; H05K 1/181–187; H01L 23/49555; H01L 23/49531; H01L 23/19562; H01L 23/49575; H01L 23/5386; H01L 23/3735

USPC .......................... 361/772–784, 813; 439/76.1
  See application file for complete search history.

(56) References Cited

U.S. PATENT DOCUMENTS

| 2011/0199800 A1* | 8/2011 | Yahata | B60L 3/003 363/131 |
|---|---|---|---|
| 2016/0294379 A1* | 10/2016 | Hayashiguchi | H02H 9/046 |
| 2017/0162466 A1* | 6/2017 | Sawada | B60L 50/51 |
| 2018/0160569 A1* | 6/2018 | Yoshihara | H01L 29/1608 |
| 2018/0286781 A1* | 10/2018 | Yoshihara | F28F 3/022 |
| 2018/0367054 A1* | 12/2018 | Morinaga | H01L 29/66462 |
| 2019/0280611 A1* | 9/2019 | Chung | H05K 7/14329 |

(Continued)

FOREIGN PATENT DOCUMENTS

| DE | 102006050291 | 5/2007 |
|---|---|---|
| DE | 102006008632 | 8/2007 |
| DE | 102015012915 | 4/2017 |

OTHER PUBLICATIONS

German Application DE 10 2019 220 010.9.

*Primary Examiner* — Tuan T Dinh
(74) *Attorney, Agent, or Firm* — Crowell & Moring LLP

(57) ABSTRACT

In a half-bridge module for an inverter, semiconductor switches and signal and power connections are arranged on a first surface of a substrate and coated with a casting compound, and external connection contacts for the signal and power connections extend through the casting compound to the exterior. In various embodiments, the external connection contacts extend from the casting compound from four second surfaces that are orthogonal to the first surface, and have a first right angle bend outside the casting compound, such that the ends of the external connection contacts are perpendicular to the first surface. The invention also relates to a corresponding inverter.

15 Claims, 5 Drawing Sheets

(56) References Cited

U.S. PATENT DOCUMENTS

Figure 1:
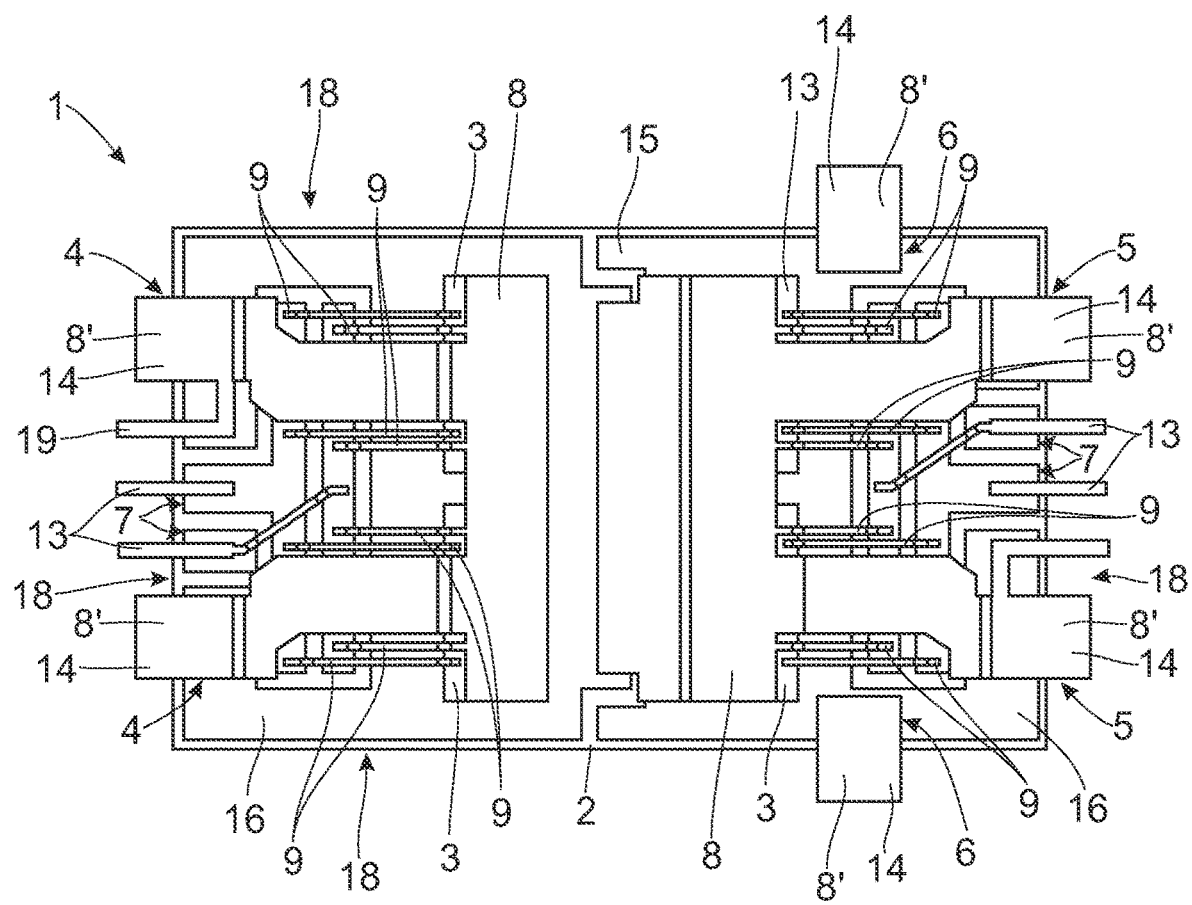

| | | | |
|---|---|---|---|
| 2019/0335628 A1* | 10/2019 | Lei | H01L 23/473 |
| 2020/0066686 A1* | 2/2020 | Mohn | H02M 7/003 |
| 2020/0112111 A1* | 4/2020 | Truessel | H05K 7/14329 |

* cited by examiner

HALF-BRIDGE MODULE FOR AN INVERTER OF AN ELECTRIC DRIVE OF AN ELECTRIC VEHICLE OR A HYBRID VEHICLE AND AN INVERTER FOR AN ELECTRIC DRIVE OF AN ELECTRIC VEHICLE OR A HYBRID VEHICLE

CROSS-REFERENCE TO RELATED APPLICATIONS

This application claims priority from German Application No. DE102020205420.7, filed on Apr. 29, 2020, the entirety of which is hereby fully incorporated by reference herein.

The invention relates to half-bridge module for an inverter in an electric drive for an electric vehicle or a hybrid vehicle according to the preamble of claim 1, and a corresponding inverter.

Both purely electric vehicles and hybrid vehicles are known from the prior art, which are powered exclusively or partially by one or more electric machines in the form of drive assemblies. To supply the electric machines in these electric or hybrid vehicles with electrical energy, the electric and hybrid vehicles comprise electric energy storage units, in particular rechargeable electric batteries. These batteries form DC voltage sources, although the electric machines normally require AC voltage. For this reason, there is normally a power electronics with a so-called inverter interconnected between a battery and an electric machine in an electric or hybrid vehicle.

These inverters normally comprise semiconductor switches, usually formed by transistors. These semiconductor switches have different degrees of integration, specifically either as discrete individual switches with a low degree of integration but high level of scalability, bridge modules with a high degree of integration but lower scalability, or as half-bridge modules, ranging between the individual switches and the bridge modules with regard to the degree of integration and scalability.

An electronic module is disclosed in DE 10 2006 050 291 A1, which comprises a semiconductor power switch and a semiconductor diode. A lower surface of the semiconductor power switch comprises an output contact mounted on a chip field on a carrier strip, and an upper surface of the semiconductor power switch comprises a control contact and an input contact. An anode contact on the semiconductor diode is located on the input contact on the semiconductor power switch and electrically connected thereto. A cathode contact on the diode is electrically connected to the output contact on the semiconductor power switch.

DE 10 2006 008 632 A1 discloses a semiconductor power component that comprises a flat lead frame, at least one vertical semiconductor power component, and at least one more electronic component. The vertical semiconductor power component has a first side and a second side. At least one first contact surface and at least one control contact surface are located on the first side, and a second contact surface is located on the second side. The at least one more electronic component is located on the second contact surface on the vertical semiconductor power component.

A semiconductor module that has at least one first semiconductor element is known from DE 10 2015 012 915 A1, which has a first side with at least one first electrode, and a second side with at least one second electrode. The first semiconductor element is located above the second semiconductor element, and an electrically conductive connection is located between the first semiconductor element and the second semiconductor element, wherein the at least one second electrode on the first semiconductor element is mechanically and electrically connected to the electrically conductive connection, and the at least one first electrode on the second semiconductor element is mechanically and electrically connected to the electrically conductive connection.

A half-bridge module is known from the not yet published DE 10 2019 220 010.9—the disclosure of which should be included in the present patent application—in which the signal connections and the power connections are all located on the same side of the substrate and encompassed in a casting compound. The power connections and the signal connections can all be accessed from the same side of the substrate such that the power connections and signal connections extend through the casting compound, seen from the same side of the substrate, and are located within a base surface spanning the substrate, seen from the direction in which they pass through the casting compound.

The known semiconductor switches have disadvantages, in that they either have a comparably poor heat dissipation, an uneven current distribution, require a large installation space, or have comparably high production costs.

The object of the invention is to propose an improved half-bridge module for an inverter in an electric drive for an electric or hybrid vehicle.

This object is achieved according to the invention by the half-bridge module for an inverter in an electric drive for an electric or hybrid vehicle according to claim 1. Advantageous embodiments and developments of the invention can be derived from the dependent claims.

The invention relates to a half-bridge module for an inverter in an electric drive for an electric or hybrid vehicle comprising a substrate, semiconductor switches, power connections and signal connections, wherein the signal connections are electrically connected to the semiconductor switches such that the semiconductor switches can be switched via the signal connections, and wherein the power connections are electrically connected to the semiconductor switches such that the semiconductor switches allow or interrupt an electrical power transfer between the power connections, wherein the semiconductor switches, signal connection and power connections are all located on a first surface of the substrate and coated with a casting compound, and wherein external connection contacts for the signal connections and external connection contacts for the power connections extend through the casting compound to the exterior. The half-bridge module according to the invention is distinguished in that the external connection contacts for the signal connections and the external connection contacts for the power connections extend from the casting compound from four second surfaces, which extend orthogonally to the first surface, and at least the external connection contacts for the signal connections or the external connection contacts for the power connections are bent at a first right angle outside the casting compound, such that ends of the external connection contacts for the signal connections and/or ends of the external connection contacts for the power connections are perpendicular to the first surface.

A half-bridge module is therefore intended that can be used in an inverter, wherein the inverter is then used to supply AC voltage to an electric motor in an electric vehicle or hybrid vehicle.

The half-bridge module comprises a substrate, which can be a DBC (Direct Bonded Copper) substrate, AMB (Active Metal Brazing) substrate, or IM (Insulated Metal) substrate. Semiconductor switches, as well as the associated power connections and signal connections, in particular transistors and diodes, are located on substrate. The substrate is preferably rectangular, having two pairs of opposing side edges. The substrate can also be square.

The signal connections are used for switching the semiconductor elements and are electrically connected to a signal contact on the semiconductor switch. Depending on the design of the semiconductor switch, the semiconductor switch can be switched between on and off by providing current to the signal contact or subjecting the switching surface to a voltage.

The power connections are electrically connected to power contacts on the semiconductor switches, such that electricity can be transferred from one power connection, through a semiconductor switch, to another power connection. The electricity supplied to the electric motor for powering the electric vehicle or hybrid vehicle is provided via the power connections.

The semiconductor switches, power connections, and signal connections in the half-bridge module according to the invention are all located on a first surface of the substrate, and the power connections and signal connections can come in contact there in a simple manner with external connection contacts. The first side is preferably one of the two larger surfaces of the substrate. The external connection contacts can be in the form of, e.g. wires, pins, or conductor paths, and can be soldered or bonded to the power connections or signal connections.

In order to protect the semiconductor switches against environmental effects, the power connections and signal connections are coated with a casting compound. Only the external connection contacts of the signal connections and the power connections extend through the casting compound to the exterior, and thus enable electric contact to the signal connections and power connections from outside the half-bridge module.

According to the invention, the external connection contacts for the signal connections and the external connection contacts for the power connections extend from the casting compound from four second surfaces that extend orthogonally to the first surface. The second surfaces are the "side surfaces" of the coated substrate, which are normally much smaller than the first surface. The external connection contacts for the signal connections and the power connections are therefore parallel to the first surface, as long as they do not have a first right angle bend. The bend is such that the ends of the external connection contacts are perpendicular to the first surface. The ends therefore point in the direction indicated by the "upper surface" of the first surface, on which the semiconductor switches, power connections, and signal connections are arranged.

A "right angle bend" as set forth in the invention is not only, or not necessarily understood to be a sharp bend, and instead, the bend can exhibit a radius, and can assume the form of an arc segment or portion of an oval, as long as the connection contacts are bent 90°.

This arrangement of the external connection contacts results in a very inexpensive means for producing the half-bridge module according to the invention, without impairing other substantial properties, i.e. heat dissipation or installation space requirements. Bending the ends upward also enables a comparatively simple and therefore likewise economical electrical contact to the external connection contacts.

In particular, only the ends of the external connection contacts for the signal connections or the ends of the external connection contacts for some or all of the power connections need to be bent upward in order to be able to make contact with the different types of external connection contacts in different ways. This also contributes to a simple production of the half-bridge module, and thus to cost reductions.

This results in particular in the advantage that the power connections and the signal connections can be easily separated from one another, and contact thereto can be obtained from above. Contact to the power connections or signal connections can therefore be three dimensional, such that the half-bridge module exhibits a particularly low leakage inductance in the commutation cell, on the order of a few nanohenrys, and also exhibits low leakage inductance in the signal connections. The commutation cell represents a current path during the switching procedure. A low leakage inductance results in low switching losses.

According to another particularly preferred embodiment of the invention, the semiconductor switches form insulated-gate bipolar transistors and/or silicon carbide metal-oxide-semiconductor field-effect transistors. Insulated-gate bipolar transistors are generally known as so-called IGBTs, and silicon carbide metal-oxide-semiconductor field-effect transistors are known in general as so-called SiC-MOSFETs. These types of semiconductor switches are comparatively suitable for low-loss and quick switching, and for high currents.

According to a particularly preferred embodiment of the invention, each insulated-gate bipolar transistor has a dedicated free-wheeling diode. The free-wheeling diodes protect their dedicated insulated-gate bipolar transistors from inductive voltage surges, in particular when switching electrical powers.

According to a preferred embodiment of the invention, the external connection contacts for the signal connections form signal connection contact pins, and the external connection contacts for the power connections form extended legs of lead frames. The signal connection contact pins form so-called "pins," i.e. wire-like plug-in contacts with a round or polygonal cross section. So-called "solder pins" are also conceivable and preferred, which can be used to create a solder connection, or insert pins, which can be inserted into the half-bridge module. These pins are inexpensive, easily shaped, and readily contacted. They are particularly suitable for conducting low to medium amperages. The extended legs of the lead frames are extensions on the lead frames that form contacts, used for establishing contact with the power connections and the power contacts on the semiconductor switches in the half-bridge elements. The extended legs are substantially designed as conductor paths, and are particularly suitable for conducting medium to higher amperages.

The lead frames are preferably stamped from sheet metal, and exhibit a suitable thickness and material for the amperage that is to be conducted. The lead frames particularly preferably have a three dimensional profile, i.e. there are rises generated by bending, preferably located between two semiconductor switches or power connections that are to be connected, and depressions generated by bending, preferably for contact with semiconductor switches or power connections. Each lead frame is a single element, and can connect numerous semiconductor components and power connections to one another. Lead frames are also known as so-called "grids".

According to another preferred embodiment of the invention, the external connection contacts for the signal connections and/or the external connection contacts for the power connections exhibit a second right angle bend outside the casting compound, such that the ends of the external connection contacts for the signal connections and/or the ends of the external connection contacts for the power connections are parallel to the first surface, and located within a base surface spanning the substrate. The second right angle bend therefore results in the external connection contacts for the signal connections, or the external connection contacts for the power connections are substantially U-shaped, wherein the ends of the external connection contacts are parallel to the first surface, and lie in particular on the casting compound. This results in the advantage that the power connections and the signal connections lie within a base surface spanning the substrate, which corresponds to the first surface. Because the power connections and signal connections no longer extend to the side in this embodiment, advantages with regard to installation space are obtained.

According to another preferred embodiment of the invention, the external connection contacts for the signal connections extend from two parallel, opposing second surfaces. This results in the advantage that the different semiconductor switches on the substrate can be controlled via the shortest possible signal lines, and therefore with low losses and delays.

According to another preferred embodiment of the invention, the external connection contacts for the power connections extend from four second surfaces. At least one power contact therefore extends from each of the four second surfaces. This results in a simple contact to the power connections via the shortest possible conductor paths or lead frames.

According to another preferred embodiment of the invention, the power connections can be designed as negative connections, phase connections, and positive connections, wherein the negative connections and the phase connections extend from two parallel, opposing second surfaces. There are therefore different types of power connections, specifically positive connections, negative connections, and phase connections, wherein the positive connections are used to supply electrical current, and the negative connections are used to discharge electrical current. The phase connections provide the actual AC voltage power supply for the electric motor. The arrangement of the negative connections and the phase connections extending from two parallel, opposing second surfaces facilitates contact to the power connections, in particular the negative connections and the phase connections, via the shortest possible conductor paths or lead frames.

According to a particularly preferred embodiment of the invention, the positive connections extend from two parallel, opposing second surfaces, which are orthogonal to the second surfaces from which the negative connections and phase connections extend. This also facilitates contact to the power connections, in particular the positive connections, via the shortest possible conductor paths or lead frames.

According to another preferred embodiment of the invention, the half-bridge module comprises two additional electric connections, the electric connection of which to the half-bridge module is configured as a return line for a control current. With an insulated-gate bipolar transistor, one of the additional electrical connections is used as a so-called Kelvin emitter, and with a silicon carbide metal-oxide-semiconductor field-effect transistor, one of the additional electrical connections is used as a so-called Kelvin source. Both the Kelvin emitter and the Kelvin source serve as return lines for a control current. The retroactive effects of the load current to the control current are minimized by this type of contact. Furthermore, a power connection in conjunction with one of the two additional electrical contacts can be used for inductive short circuit detection. The voltage drop between the power connection and the additional electrical connection is preferably measured for this.

The control current is sent to the signal contacts for the semiconductor component, and switches the semiconductor component either on or off.

According to a particularly preferred embodiment of the invention, external connection contacts for the two additional electric connections extend from the same second surfaces as the external connection contacts for the signal connections. This has proven to be advantageous with regard to establishing contact to the external connection contacts for the two additional electric connections, as well as the signal contacts for the semiconductor switches.

The invention also relates to an inverter for an electric drive in an electric vehicle or a hybrid vehicle, comprising at least three half-bridge modules according to the invention. The advantages described above in conjunction with the half-bridge module according to the invention are therefore also obtained for the inverter according to the invention.

Figure 2A:
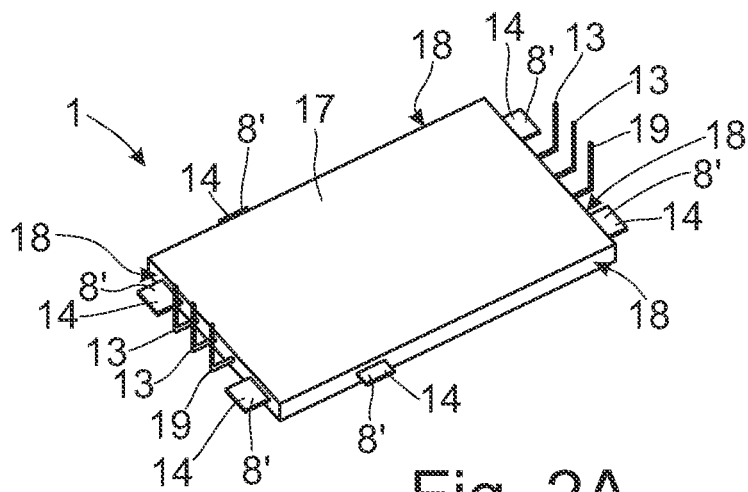
Figure 2B:
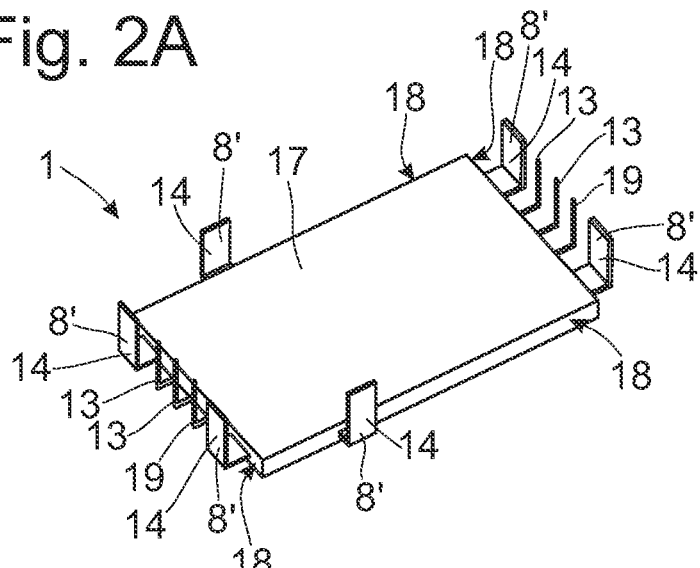
Figure 2C:
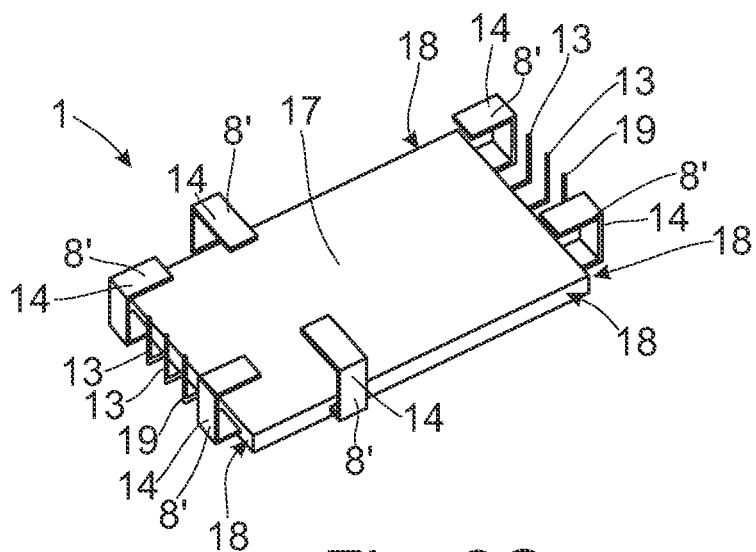
Figure 3:
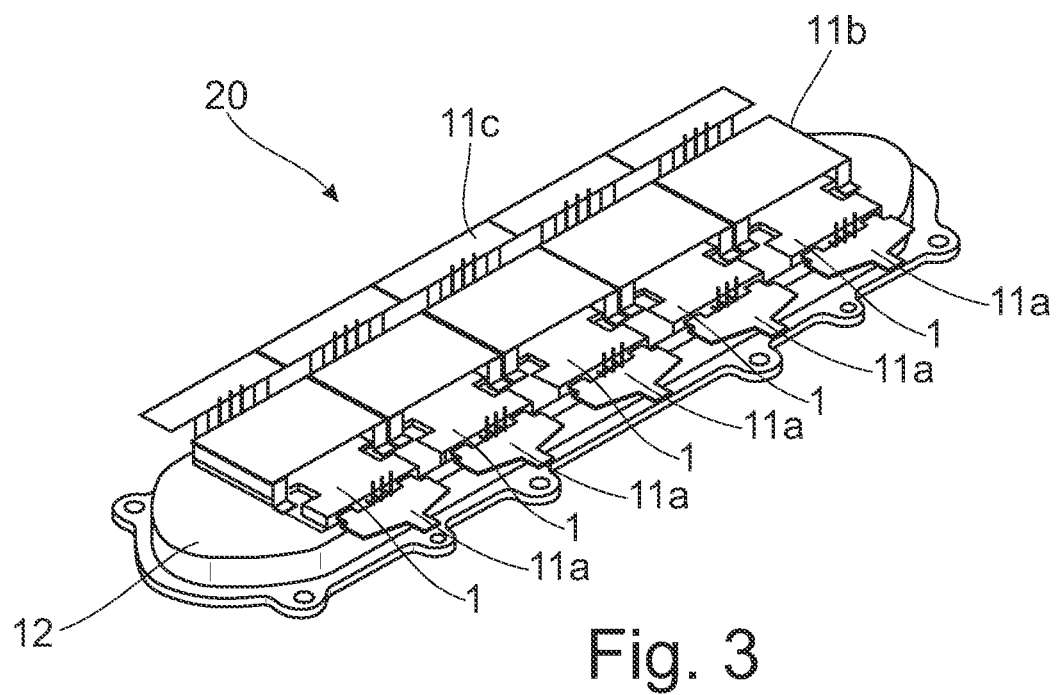
Figure 4A:
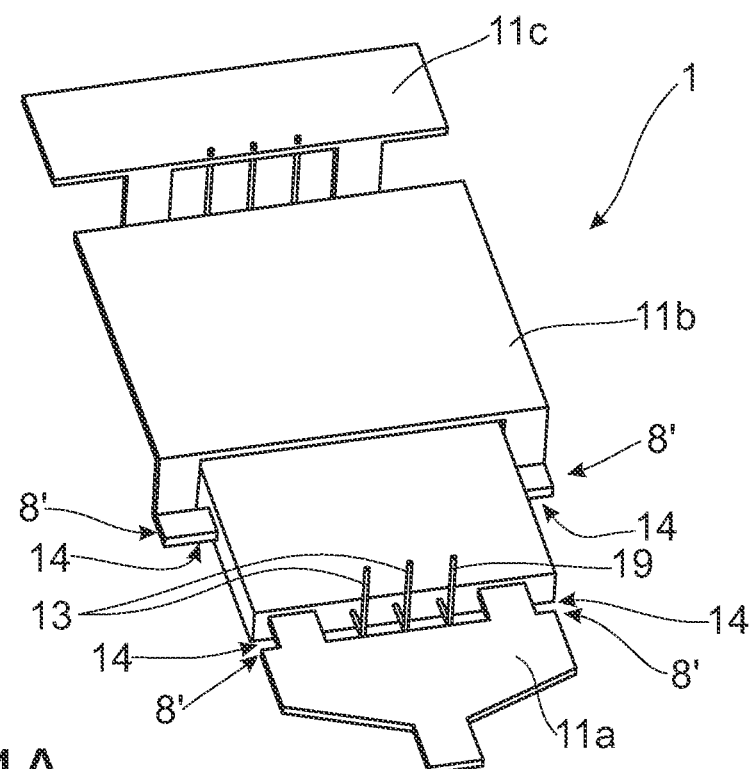
Figure 4B:
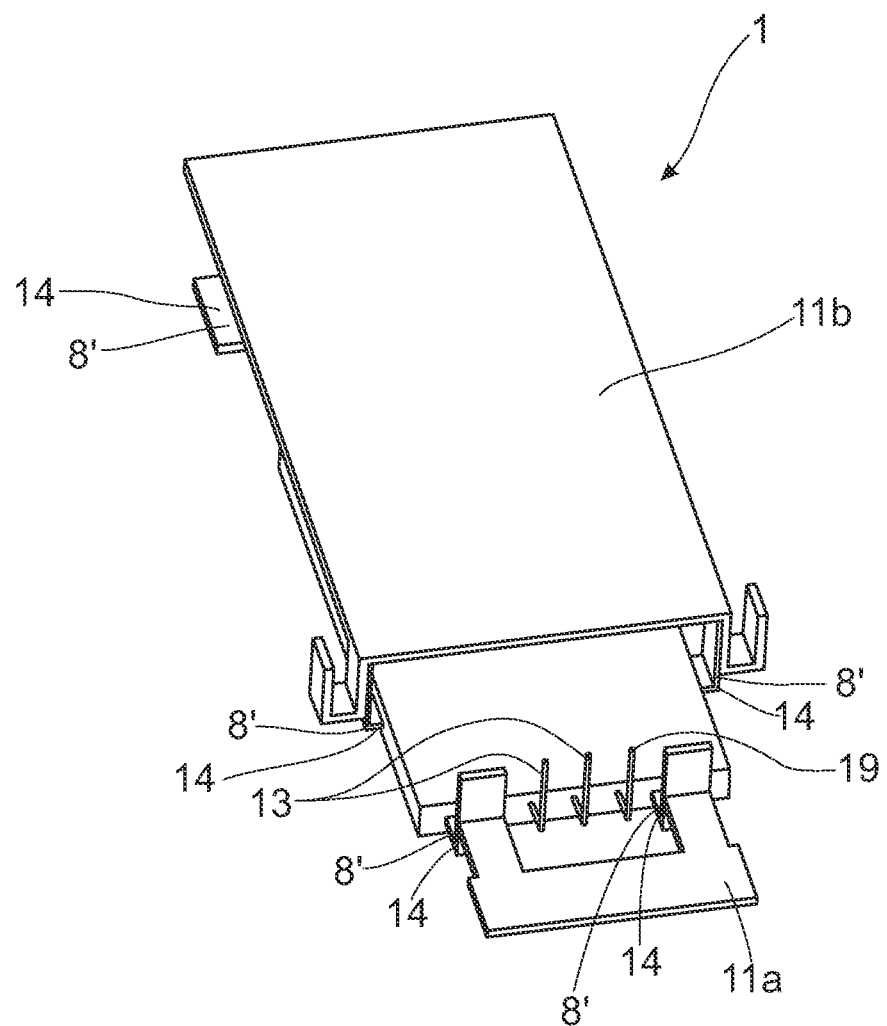
Figure 4C:
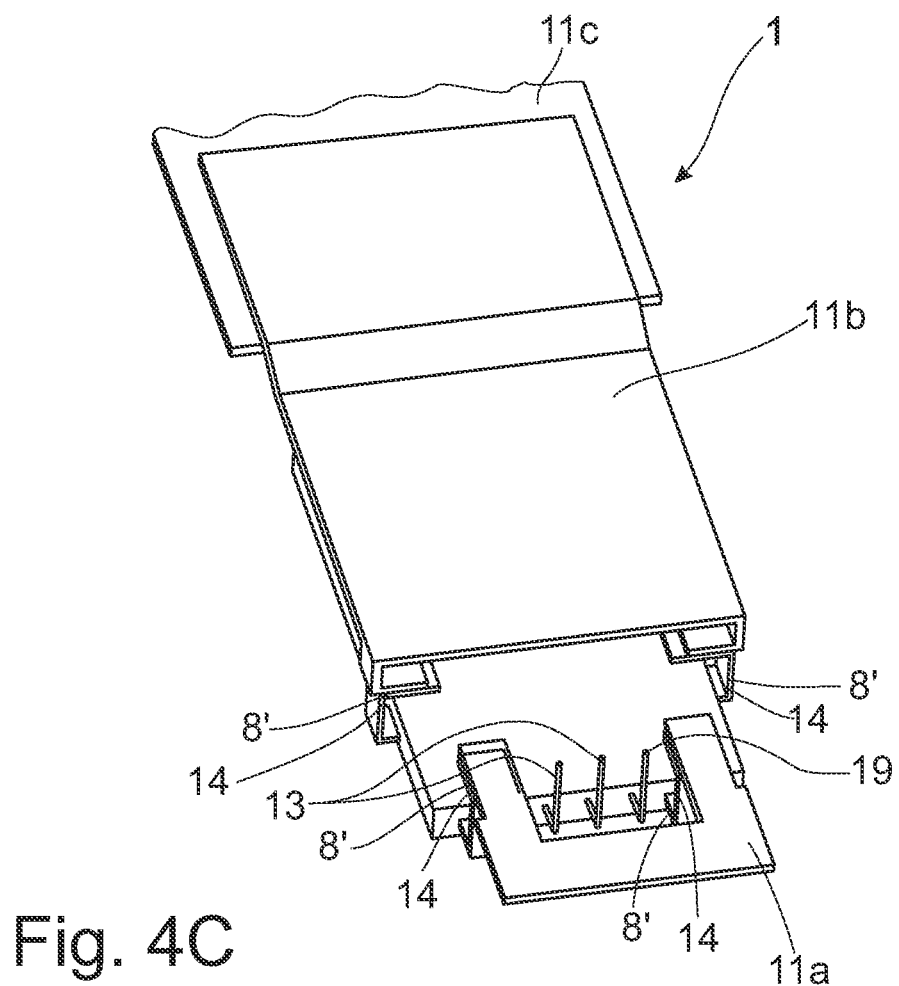
Figure 5:
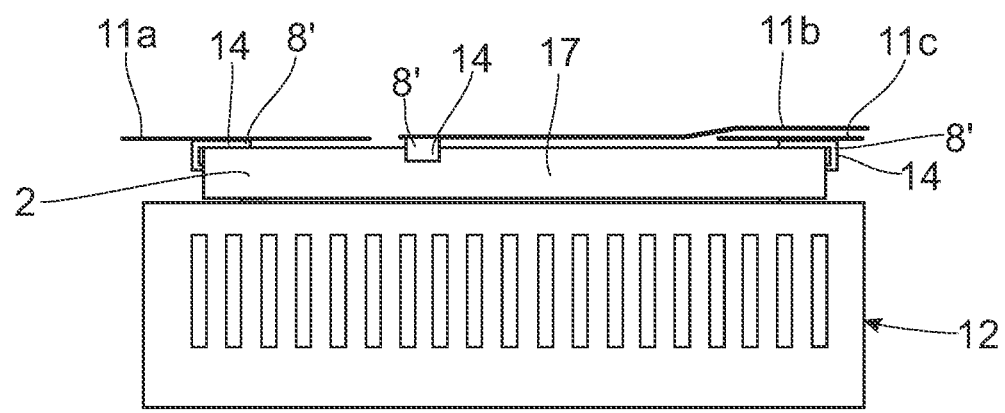

The invention shall be explained below by way of example, based on the embodiments shown in the figures. Therein:

FIG. 1 shows, by way of example and schematically, a possible structure for a half-bridge module according to the invention for an inverter in an electric drive for an electric vehicle or a hybrid vehicle, without external connection contacts for the signal connections and without external connection contacts for the power connections, FIG. 2A shows, by way of example and schematically, a possible embodiment of a half-bridge module according to the invention, FIG. 2B shows, by way of example and schematically, another possible embodiment of a half-bridge module according to the invention, FIG. 2C shows, by way of example and schematically, another possible embodiment of a half-bridge module according to the invention, FIG. 3 shows, by way of example and schematically, a possible embodiment of an inverter according to the invention for a power electronics in an electric vehicle or hybrid vehicle, FIG. 4A shows, by way of example, different possibilities for establishing contact to the different external connection contacts for the power connections through the busbars, FIG. 4B shows, by way of example, other possibilities for establishing contact to the different external connection contacts for the power connections through the busbars, FIG. 4C shows, by way of example, other possibilities for establishing contact to the different external connection contacts for the power connections through the busbars, and FIG. 5 shows a schematic side view of the half-bridge module in FIG. 4C, and a cooling device, on which the half-bridge module 1 is located.

The same objects, functional units, and comparable components have the same reference symbols throughout the figures. These objects, functional units and comparable components are identical with regard to their technical features, as long as not otherwise specified, explicitly or implicitly, in the description.

FIG. 1 shows, by way of example and schematically, a first possible embodiment of a half-bridge module 1 according to the invention for an inverter 20 in an electric drive for an electric vehicle or hybrid vehicle. For purposes of clarity, the casting compound 17 is not shown. The half-bridge module 1 comprises a substrate 2 in the form of a DBC (Direct Bonded Copper) substrate 2 with a ceramic carrier plate and copper coating 16 on both sides, as well as semiconductor switches 3, power connections 4, 5, 6, and signal connections 7, arranged in a plane on a first surface 15 of the substrate 2. The power connections are covered in FIG. 1 by legs 8' extending from lead frames 8. The extended legs 8' on the lead frames 8 come in contact with the power connections 4, 5, 6 from above and then extend laterally from the casting compound 17 from four second surfaces 18 extending orthogonally to the first surface 15, as external connection contacts for the power connections 14. The power connections 4, 5, 6 form positive connections 6, negative connections 4, and phase connections 5. The positive connections 6 and the phase connections 5 are electrically connected to the semiconductor switches 3 via the lead frames 8 such that the semiconductor switches 3 allow or interrupt transmission of electricity between the power connections 4, 5, 6. The signal connections 7 are electrically connected to the semiconductor switches 3 such that the semiconductor switches can be switched via the signal connections 7. The electrical connection of the signal connections to the semiconductor switches 3 is obtained, e.g., with bond wire 9. External connection contacts for the signal connections 13 form signal connection contact pins 13 according to this example, and extend from two parallel, opposing second surfaces 18. They each have a right angle bend, such that the ends of the external connection contacts for the signal connections 13 are perpendicular to the first surface 15. The half-bridge module 1 also comprises external connection contacts for two additional electrical connections 19, the electrical connection to the half-bridge module 1 of which is configured for returning control current. As can be seen in the figure, the external connection contacts for the two additional electrical connections 19 extend from the same second surfaces 18 as the external connection contacts for the signal connections 13. The semiconductor switches 3 form so-called insulated-gate bipolar transistors 3, also known as insulated gate bipolar transistor (IGBT), according to this example.

FIG. 2A shows, by way of example and schematically, a possible embodiment of an half-bridge module 1 according to the invention, that has external connection contacts for the signal connections 13 and external connection contacts for the power connections 14. The power connections 4, 5, 6, the signal connections 7, and the semiconductor switches 3 are not shown in FIG. 2, because they are covered by the casting compound 17. Only the external connection contacts for the signal connections 13 and the external connection contacts for the power connections 14 extend laterally from the casting compound 17 from four second surfaces 18, which are orthogonal to the first surface 15. Under the casting compound 17, the external connection contacts for the signal connections 13 are electrically connected to the signal connections 7, and the connection contacts for the power connections 14 are electrically connected to the power connections 4, 5, 6. As can be seen in the figure, the external connection contacts for the signal connections 13 have a first right angle bend, such that the ends of the external connection contacts for the signal connections 13 are perpendicular to the first surface 15. This facilitates contact to the external connection contacts for the signal connections 13. The external connection contacts for the signal connections 13 form signal connection contact pins 13, and extend from two parallel, opposing second surfaces 18. The external connection contacts for the power connections 14 extend from all four second surfaces 18. In accordance with their electrical connections to the power connections 4, 5, 6 within the casting compound 17, the external connection contacts for the power connections enable contact to the positive connections 6, the negative connections 4, and the phase connections 5. The half-bridge module 1 also comprises external connection contacts for two additional electrical connections 19, the electrical connection to the half-bridge module 1 of which is configured for returning a control current. As can be seen in the figure, the external connection contacts for the two additional electrical connections 19 extend from the same second surfaces 18 as the external connection contacts for the signal connections 13.

FIG. 2B shows another possible embodiment for a half-bridge module 1 according to the invention. The half-bridge module 1 in FIG. 2B differs from the half-bridge module 1 in FIG. 2A only in that the external connection contacts for the power connections 14 likewise have a first bend, such that their ends likewise are perpendicular to the first surface 15.

FIG. 2C shows yet another possible embodiment of a half-bridge module 1 according to the invention. The half-bridge module 1 in FIG. 2C differs from the half-bridge module 1 in FIG. 2B in that the external connection contacts for the power connections 14 also have a second bend, following the first bend, such that the ends of the external connection contacts for the power connections 14 are parallel to the first surface 15, and located within a base surface spanning the substrate 2. As a result, the power connections and signal connections can be contacted from above, such that the half-bridge module exhibits a particularly low leakage inductance in the commutation cell, as well as low leakage inductances in the signal connections.

FIG. 3 shows, by way of example and schematically, a possible embodiment of an inverter 20 according to the invention for an electric drive in an electric vehicle or a hybrid vehicle. The inverter 20 comprise five half-bridge modules 1 according to the invention in this example, wherein the phase connections 5 are each in contact with a first busbar 11a via corresponding external connection contacts for the power connections 14. The positive connections 6 and the negative connections 4 are in contact with a second shared busbar 11b or a third shared busbar 11c, respectively, via the corresponding external connection contacts for the power connections 14. The half-bridge modules 1 are arranged on a cooling device 12 in the form of a water cooler via a sinter layer, not shown in FIG. 3.

FIG. 4 shows, by way of example, different contact possibilities for the various external connection contacts for the power connections 14 through the busbars 11a, 11b and 11c, depending on their designs. By way of example, the external connection contacts for the power connections 14 in FIG. 4A are not bent, and therefore extend in a straight line from the second surfaces 18. This enables a very simple and economical electric contact by placing the busbars 11a, 11b, and 11c on the external connection contacts for the power connections 14 from above. The connection points can be soldered or welded. The exemplary embodiment shown in FIG. 4B shows external connection contacts for the power connections 14 that each have a first right angle bend. The external connection contacts for the power connections 14 therefore point upward. The electrical connection to the busbar 11a is obtained in that the busbar 11a is placed on the two front external connection contacts for the power connections 14. The connection points can also be soldered or welded in this case. The busbar 11b can be brought into electrical contact with all of the lateral external connection contacts for the power connections 14 from above. Because this results in a mechanical tension between the busbar 11b and the two lateral external connection contacts for the power connections 14, it is not necessary to solder or weld the connection points where the busbar 11b is connected to these two external connection contacts for the power connections 14. This results in a particularly economic electrical connection. The exemplary embodiment shown in FIG. 4C has external connection contacts for the power connections 14 that each have a first right angle bend and a second right angle bend. As a result, the external connection contacts for the power connections 14 can be placed in contact with the bus bars 11a, 11b, 11c from above in a comparatively simple and space-saving manner. As can be seen in the figure, the busbar 11c is placed underneath the busbar 11b, such that a three dimensional commutation cell is obtained.

FIG. 5 shows, in a schematic side view, the half-bridge module 1 from FIG. 4C, and a cooling device 12, on which the half-bridge module 1 is placed. The three dimensional commutation cell can be particularly easily identified in FIG. 5, composed of the busbars 11a, 11b, 11c, the external connection contacts for the power connections 14, and the power connections 4, 5 and 6 and semiconductor switches 3 covered by the casting compound 17.

REFERENCE SYMBOLS 1 half-bridge module
2 substrate
3 semiconductor switch, silicon carbide metal-oxide-semiconductor field-effect transistor, insulated-gate bipolar transistor
4 power connection, negative connection
5 power connection, phase connection
6 power connection, positive connection
7 signal connection
8 lead frame
8' extended leg of a lead frame
9 bond wire
11 busbar
11a first busbar
11b second busbar
11c third busbar
12 cooling device, water cooler
13 external connection contact for the signal connections, signal connection contact pin
14 external connection contact for the power connections
15 first surface
16 copper coating
17 casting compound
18 second surfaces
19 external connection contact for the additional external connections
20 inverter

The invention claimed is:

1. A half-bridge module for an inverter for an electric drive for an electric vehicle or a hybrid vehicle, the half-bridge module comprising:
a substrate;
semiconductor switches;
power connections; and
signal connections,
wherein the signal connections are electrically connected to the semiconductor switches such that the semiconductor switches are configured to be switched via the signal connections, and wherein the power connections are electrically connected to the semiconductor switches such that the semiconductor switches allow or interrupt transmission of electricity between the power connections,
wherein the semiconductor switches, the signal connections, and the power connections are all arranged on a first surface of the substrate and coated with a casting compound,
wherein external connection contacts for the signal connections and external connection contacts for the power connections extend through the casting compound to the exterior from four second surfaces that are orthogonal to the first surface,
wherein at least one of the external connection contacts for the signal connections or the external connection contacts for the power connections have a first right angle bend outside the casting compound, such that ends of the at least one of the external connection contacts for the signal connections or the ends of the external connection contacts for the power connections are perpendicular to the first surfaces, and
wherein the external connection contacts for the power connections extend from the four second surfaces.

2. The half-bridge module according to claim 1, wherein the external connection contacts for the signal connections form signal connection contact pins, and wherein the external connection contacts for the power connections form extended legs on lead frames.

3. The half-bridge module according to claim 1, wherein:
the external connection contacts for the signal connections each have the first right angle bend outside the casting compound such that the ends of the external connection contacts for the signal connections are perpendicular to the first surface, and
wherein the external connection contacts for the power connections each have a first right angle bend and a second right angle bend outside the casting compound, such that the ends of the external connection contacts for the power connections are parallel to the first surface, and lie within a base surface spanning the substrate.

4. The half-bridge module according to claim 1, wherein the external connection contacts for the signal connections extend from two parallel, opposing second surfaces.

5. The half-bridge module according to claim 1, wherein the power connections comprise at least one negative connection, at least one phase connection, and at least one positive connection, wherein the at least one negative connection and the at least one phase connection extend from two parallel, opposing second surfaces.

6. The half-bridge module according to claim 1, wherein the half-bridge module comprises two additional external connections, the electrical connection of which to the half-bridge module is configured for returning a control current.

7. An inverter for an electric drive in an electric vehicle or a hybrid vehicle, comprising at least three of the half-bridge modules according to claim 1.

8. The half-bridge module according to claim 1, wherein:
the external connection contacts for the power connections each have the first right angle bend outside the casting compound such that the ends of the external connection contacts for the power connections are perpendicular to the first surface, and
wherein the external connection contacts for the signal connections each have a first right angle bend and a second right angle bend outside the casting compound such that the ends of the external connection contacts for the signal connections are parallel to the first surface, and lie within a base surface spanning the substrate.

9. The half-bridge module according to claim 5, wherein the at least one positive connection further comprises at least two positive connections extending from two parallel, opposing second surfaces, which are orthogonal to the two second surfaces from which the at least one negative connection and the at least one phase connection extend.

10. The half-bridge module according to claim 6, wherein external connection contacts for the two additional external connections extend from the same second surfaces as the external connection contacts for the signal connections.

11. A half-bridge module for an inverter for an electric drive for an electric vehicle or a hybrid vehicle, the half-bridge module comprising:
- a substrate;
- semiconductor switches;
- power connections; and
- signal connections,
- wherein the signal connections are electrically connected to the semiconductor switches such that the semiconductor switches are configured to be switched via the signal connections, and wherein the power connections are electrically connected to the semiconductor switches such that the semiconductor switches allow or interrupt transmission of electricity between the power connections,
- wherein the semiconductor switches, the signal connections, and the power connections are all arranged on a first surface of the substrate and coated with a casting compound,
- wherein external connection contacts for the signal connections and external connection contacts for the power connections extend through the casting compound to the exterior from four second surfaces that are orthogonal to the first surface,
- wherein at least one of the external connection contacts for the signal connections or the external connection contacts for the power connections have a first right angle bend outside the casting compound, such that ends of the at least one of the external connection contacts for the signal connections or the ends of the external connection contacts for the power connections are perpendicular to the first surface, and
- wherein the power connections comprise at least one negative connection, at least one phase connection, and at least one positive connection, wherein the at least one negative connection and the at least one phase connection extend from two parallel, opposing second surfaces.

12. The half-bridge module according to claim 11, wherein the external connection contacts for the power connections extend from the four second surfaces.

13. The half-bridge module according to claim 11, wherein the at least one positive connection further comprises at least two positive connections extending from two parallel, opposing second surfaces, which are orthogonal to the two second surfaces from which the at least one negative connection and the at least one phase connection extend.

14. A half-bridge module for an inverter for an electric drive for an electric vehicle or a hybrid vehicle, the half-bridge module comprising:
- a substrate;
- semiconductor switches;
- power connections; and
- signal connections,
- wherein the signal connections are electrically connected to the semiconductor switches such that the semiconductor switches are configured to be switched via the signal connections, and wherein the power connections are electrically connected to the semiconductor switches such that the semiconductor switches allow or interrupt transmission of electricity between the power connections,
- wherein the semiconductor switches, the signal connections, and the power connections are all arranged on a first surface of the substrate and coated with a casting compound,
- wherein external connection contacts for the signal connections and external connection contacts for the power connections extend through the casting compound to the exterior from four second surfaces that are orthogonal to the first surface,
- wherein at least one of the external connection contacts for the signal connections or the external connection contacts for the power connections have a first right angle bend outside the casting compound, such that ends of the at least one of the external connection contacts for the signal connections or the ends of the external connection contacts for the power connections are perpendicular to the first surface, and
- wherein the half-bridge module comprises two additional external connections, the electrical connection of which to the half-bridge module is configured for returning a control current.

15. The half-bridge module according to claim 14, wherein external connection contacts for the two additional external connections extend from the same second surfaces as the external connection contacts for the signal connections.

* * * * *